United States Patent [19]

Evans, Jr. et al.

[11] Patent Number: 5,434,811
[45] Date of Patent: Jul. 18, 1995

[54] NON-DESTRUCTIVE READ FERROELECTRIC BASED MEMORY CIRCUIT

[75] Inventors: Joseph T. Evans, Jr.; Richard H. Womack, both of Albuquerque, N. Mex.

[73] Assignee: National Semiconductor Corporation, Santa Clara, Calif.

[21] Appl. No.: 356,661

[22] Filed: May 24, 1989

Related U.S. Application Data

[63] Continuation of Ser. No. 122,692, Nov. 19, 1987, abandoned.

[51] Int. Cl.$^6$ .............................................. G11C 11/22
[52] U.S. Cl. .................................... 365/145; 365/149; 365/228
[58] Field of Search ............... 365/149, 154, 156, 190, 365/185, 145, 228, 117, 65

[56] References Cited

U.S. PATENT DOCUMENTS

| | | |
|---|---|---|
| 2,695,396 | 11/1954 | Anderson . |
| 2,695,397 | 11/1954 | Anderson . |
| 2,717,372 | 9/1955 | Anderson . |
| 2,717,373 | 9/1955 | Anderson . |
| 2,773,250 | 12/1956 | Aigrain et al. . |
| 2,782,397 | 2/1957 | Young . |
| 2,839,739 | 6/1958 | Anderson et al. . |
| 2,859,428 | 11/1958 | Young . |
| 2,872,661 | 2/1959 | Young et al. . |
| 2,876,435 | 3/1959 | Anderson . |
| 2,876,436 | 3/1959 | Anderson . |
| 2,884,617 | 4/1959 | Pulvari . |
| 2,884,618 | 4/1959 | Epstein . |
| 2,900,622 | 8/1959 | Rajchman et al. . |
| 2,905,928 | 9/1959 | Anderson . |
| 2,907,984 | 10/1959 | Anderson . |
| 2,918,655 | 12/1959 | Pulvari . |
| 2,922,986 | 10/1960 | Chynoweth . |
| 2,926,336 | 2/1960 | Chynoweth . |
| 2,938,194 | 5/1960 | Anderson . |

(List continued on next page.)

FOREIGN PATENT DOCUMENTS

| | | |
|---|---|---|
| 242117A1 | 1/1987 | Germany . |
| 60-31665 | 2/1985 | Japan . |
| 1544314 | 4/1979 | United Kingdom . |

OTHER PUBLICATIONS

P. Arnett, "Ferroelectric FET Device", IBM TDB, vol. 15, No. 9, Feb. 1973, p. 2825.

"Hybrid Volatile/Nonvolatile Integrated Memory Arrays," by T. M. Sullivan, *IBM Technical Disclosure Bulletin*, vol. 18, No. 5, Oct. 1975.

"Research on the Application of Ferro- and Ferrielectric Phenomena in Computer Devices," by Pulvari, *RTD Technical Documentary Report*, No. TRD-T-DR-63-4002, pp. 1-43, Oct. 1963.

*Primary Examiner*—Joseph A. Popek
*Attorney, Agent, or Firm*—Richards, Medlock & Andrews

[57] ABSTRACT

A non-volatile memory circuit comprises cross-coupled transistors which drive first and second nodes to differential voltage states. First and second ferroelectric capacitors are connected respectively between the first and second nodes and a common node. The ferroelectric capacitors are set to opposite polarization states as a function of the voltage states at the first and second differential nodes. When power is lost from the circuit, the last data state in the circuit is stored in the ferroelectric capacitors. When power is restored to the memory circuit, the ferroelectric capacitors unbalance the differential nodes to such an extent to cause the circuit to become reestablished to the last data state stored in the circuit. An input signal can be received at one of the nodes through an input transistor to set the state of the memory circuit and the state of the circuit can be read from one of the nodes through an output transistor. The input and output transistors can be the same device.

44 Claims, 3 Drawing Sheets

U.S. PATENT DOCUMENTS

| | | | |
|---|---|---|---|
| 2,955,281 | 10/1960 | Brennemann et al. | |
| 2,957,164 | 10/1960 | Long et al. | |
| 3,002,182 | 9/1961 | Anderson. | |
| 3,011,157 | 11/1961 | Anderson. | |
| 3,021,510 | 2/1962 | Anderson. | |
| 3,079,591 | 2/1963 | Anderson. | |
| 3,094,686 | 6/1963 | Hoffman. | |
| 3,104,377 | 9/1963 | Alexander et al. | |
| 3,105,225 | 9/1963 | Williams et al. | |
| 3,118,133 | 1/1964 | Meeker et al. | |
| 3,126,509 | 3/1964 | Pulvari. | |
| 3,142,045 | 7/1964 | Bobeck. | |
| 3,155,833 | 11/1964 | Fries. | |
| 3,158,842 | 11/1964 | Anderson. | |
| 3,264,618 | 8/1966 | Wanlass et al. | |
| 3,281,800 | 10/1966 | Fatuzzo et al. | |
| 3,466,618 | 9/1969 | Bartlett et al. | 365/145 |
| 3,476,951 | 11/1969 | Pulvari. | |
| 3,499,704 | 3/1970 | Land et al. | |
| 3,508,213 | 4/1970 | Hastings. | |
| 3,510,852 | 5/1970 | Bartlett et al. | |
| 3,535,686 | 10/1970 | Barnett. | |
| 3,537,079 | 10/1970 | Feisel. | |
| 3,543,258 | 11/1970 | Kaufman. | |
| 3,569,795 | 3/1971 | Gikow. | |
| 3,579,208 | 5/1971 | Bartlett. | |
| 3,599,185 | 8/1971 | Bartlett. | |
| 3,623,030 | 11/1971 | Sawyer. | |
| 3,691,535 | 9/1972 | Williams. | |
| 3,725,899 | 4/1973 | Greubel. | |
| 3,733,590 | 5/1973 | Kaufman. | |
| 3,798,619 | 3/1974 | Samofalov et al. | |
| 3,820,088 | 6/1974 | Hadni et al. | |
| 3,832,700 | 8/1974 | Wu et al. | |
| 3,859,642 | 1/1975 | Mar. | |
| 3,930,240 | 12/1975 | Hadni et al. | |
| 3,990,057 | 11/1976 | Kumada. | |
| 4,144,591 | 3/1979 | Brody | 365/228 |
| 4,161,038 | 7/1979 | Wu | 365/145 |
| 4,300,212 | 11/1981 | Simko | 365/185 |
| 4,336,089 | 11/1982 | Brody | 365/145 |
| 4,408,303 | 10/1983 | Guterman et al. | 365/205 |
| 4,477,886 | 10/1984 | Au | 365/222 |
| 4,499,560 | 2/1985 | Brice | 365/228 |
| 4,532,609 | 7/1985 | Iizuka | 365/154 |
| 4,536,785 | 8/1985 | Gibbons | 257/71 |
| 4,630,238 | 12/1986 | Arakawa | 365/185 |
| 4,703,456 | 10/1987 | Arakawa | 365/154 |
| 4,787,066 | 11/1988 | Leuschner | 365/149 |
| 4,802,124 | 1/1989 | O'Brien, Jr. | 365/185 |
| 4,809,225 | 2/1989 | Dimmler et al. | 365/145 |
| 4,853,893 | 8/1989 | Eaton, Jr. et al. | 365/145 |
| 4,860,254 | 8/1989 | Pott et al. | 365/145 |
| 4,873,664 | 10/1989 | Eaton, Jr. | 365/145 |
| 4,946,710 | 3/1990 | Miller et al. | 427/126.3 |

(EQUIVALENT CIRCUIT DURING POWER-UP)

(EQUIVALENT CIRCUIT DURING POWER-UP)

NON-DESTRUCTIVE READ FERROELECTRIC BASED MEMORY CIRCUIT

This application is a continuation, of application Ser. No. 122,692, filed Nov. 19, 1997, now abandoned.

TECHNICAL FIELD

The present invention pertains in general to electronic memory circuits and in particular to such circuits having non-volatile data storage elements.

BACKGROUND OF THE INVENTION

Integrated circuit memories have come into extensive use in many applications, particularly for computer systems. It has been a pronounced technological trend to increase the capacity and density of such memories. As manufacturing and design techniques have improved, the cost of memory circuits has decreased dramatically, and this has greatly expanded the number of applications and the size of the market. However, the low cost, large capacity integrated circuits now in use have volatile memory storage, that is, the data stored in these memories is lost when the power is removed. There are many applications that could be enhanced if low cost memories could be made which are non-volatile. In certain applications, it is essential that the data be retained in the memory when power is removed. To fill this market, there have been developed a number of types of non-volatile memories. Among the most common of these now in use is the electronically programmable read only memory (EPROM). However, the non-volatile memories now available typically have a rather low density of memory storage, are generally complex to manufacture, often have a limited lifetime and are much more expensive than volatile memories. The need for non-volatile memory storage in integrated circuits has long been recognized, but a low cost solution has not yet been found.

The phenomenon of ferroelectric materials has been recognized and studied for many years. Such materials have multiple orientation states which can be selected by the application of an electric field. The particular orientation state which is set in a ferroelectrical material can be used to represent a data state. This orientation state is retained even when no further power is applied to the material. It is thus possible to store a particular state in a non-powered device and then to read the data state at a later time. It has long been recognized that ferroelectric materials could serve as a memory element in an electrical circuit. An early recognition of this application is shown in U.S. Pat. No. 2,695,396 to Anderson. Since the Anderson patent, there have been more disclosures of circuitry which utilize ferroelectric elements from memory storage. Such patents include 4,144,591 to Brody, 4,149,301 to Cook and 4,360,896 to Brody. Still other patents report circuits which use ferroelectric materials in a memory. But, despite the numerous references to reports of ferroelectrical memory devices, there has to date been no known device of this type which has been introduced into the commercial market. The demand for non-volatile memories is well recognized and the apparent applicability of ferroelectric materials has been reported. But, numerous problems have been experienced in both the manufacture and design of practical ferroelectric devices.

The present invention sets forth a circuit design for a ferroelectric memory which takes advantage of the non-volatile characteristics of such memory elements, while providing fast, reliable writing and reading of data for such circuits.

SUMMARY OF THE INVENTION

A selected embodiment of the present invention is a non-volatile memory circuit which comprises first and second transistor circuit means having respective first and second nodes. The circuit means are cross-coupled for producing differential voltage states at the first and second nodes. A first ferroelectric capacitor is connected between the first node and a common node. A second ferroelectric capacitor is connected between the second node and the common node. The ferroelectric capacitors are set to polarization states determined by the voltage states at the first and second nodes relative to the common node.

A further aspect of the present invention is a method for reestablishing the data state previously set in the memory circuit. In this method, the common node is grounded during power-up wherein each of the ferroelectric capacitors is connected to a respective one of the differential nodes. The ferroelectric capacitor having a reverse polarization effectively has a greater capacitance than the positive polarized capacitor, both polarizations being taken with respect to the common node. When power is applied to the circuit, the unbalancing effect of the two capacitances causes the nodes to be differentially set to the original data state.

In a still further aspect of the present invention, the data state is restored to the memory circuit by applying a pulse to the common node. This causes a net charge transfer through the capacitor which is reverse pulsed relative to the previously set polarization. The effect of this pulsing is to deposit charge at the differential node which previously had a high voltage state. When power is applied to the circuit, the node having the retained charge is driven to a high voltage state thereby reestablishing the initial data condition set in the memory circuit.

BRIEF DESCRIPTION OF THE DRAWINGS

For a more complete understanding of the present invention and the advantages thereof, reference is now made to the following Detailed Description taken in conjunction with the following Drawings, in which.

DETAILED DESCRIPTION OF THE INVENTION

The present invention utilizes a ferroelectric capacitor as a non-volatile storage element in an electronic memory. It has been well established that ferroelectric capacitors can be set to have first and second opposite polarization states. Such operation with a ferroelectric capacitor is shown in U.S. Pat. Nos. 2,695,396, 3,155,833 and 4,360,896. It has been found that a ferroelectric ceramic material having a designation PLZT is suitable for use in accordance with the present invention. PLZT is a perovskite composition made up of lead, lanthanum, zirconium and titanium. This ferroelectric material can be produced as described in U.S. Pat. No. 4,946,710, issued Aug. 7, 1990, and entitled Method for Preparing PLZT and PZT Sol-Gels and Fabricating Ferroelectric Thin Films. A further description of ferroelectric materials is in "Sol-Gel Processing of $PbTiO_3$, PZT, PLZT Thin Films", *Brit. Cer. Proc.*, Vol. 36, 1985, pages 107–121 and "Preparation of Ferroelectric PZT Films by Thermal Decomposition of Organometallic Compounds", *Journal of Materials Science*, Vol. 19, 1984, pages 595–598.

Figure 1:
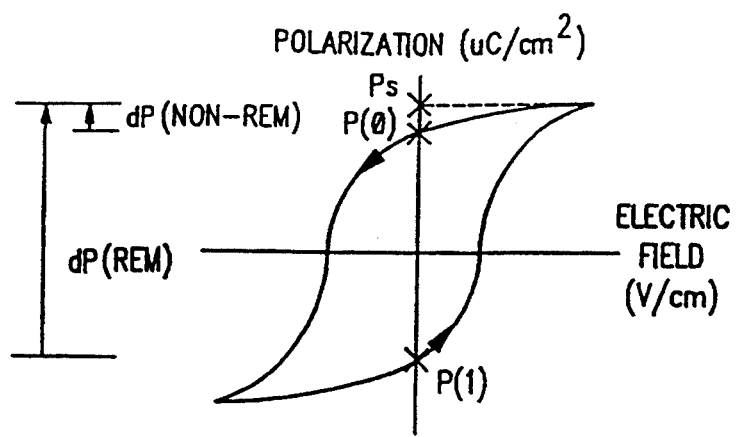
FIG. 1 is a hysteresis curve illustrating the polarization characteristics of a ferroelectric capacitor.

Referring now to FIG. 1 there is illustrated a hysteresis curve showing the polarization versus electric field for a ferroelectric capacitor. When a positive electric field is applied across the terminals of a ferroelectric capacitor, there is produced the polarization state indicated as Ps. As the electric field intensity decreases toward 0, the polarization is shown by the upper right quadrant curve. When the electric field intensity has decreased to 0, the polarization state can be designated as P(0). When the electric field intensity becomes negative, the polarization of the capacitor is shown by the curve which extends through the upper left and lower left quadrants. As the negative electric field returns to 0, the hysteresis of the capacitor produces a polarization state P(1), which is a negative polarization state. When a positive electric field is again applied to the terminals of the ferroelectric capacitor, the polarization is indicated by the curve extending through the lower right and upper right quadrants until the polarization state Ps is again reached. It can be seen that with alternating positive and negative polarity electric fields that the polarization will be indicated by traveling counterclockwise around the hysteresis curve as indicated by the arrows in the curve.

The polarization between the P(0) and P(1) points is termed remnant because it remains after the electric field is removed. The polarization between the Ps and P(0) points is termed non-remnant since it is lost when the electric field goes from a maximum to zero.

Figure 2:
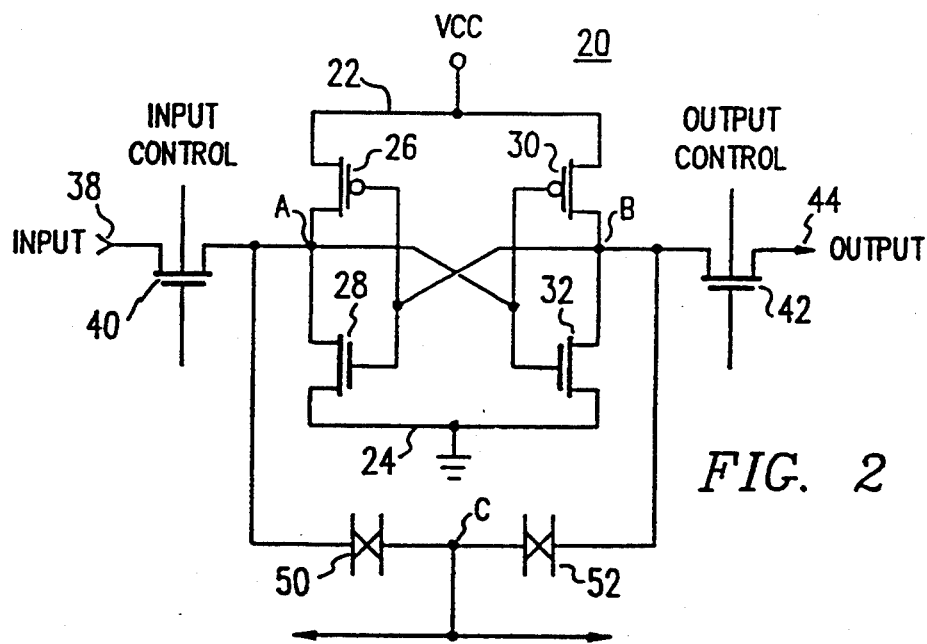
FIG. 2 is a schematic diagram of a non-volatile flip-flop circuit in accordance with the present invention.

Referring now to FIG. 2, there is illustrated a memory circuit 20 in accordance with the present invention. The circuit 20 includes power terminals 22 and 24 which are labelled respectively with $V_{cc}$ and a circuit ground symbol. An enhancement p-channel mode MOS transistor 26 has the drain terminal thereof connected to the power terminal 22 and the source terminal thereof connected to a node A. An enhancement mode n-channel MOS transistor 28 has the drain terminal thereof connected to node A and the source terminal connected to the ground terminal 24.

A second enhancement mode p-channel MOS transistor 30 has the drain terminal thereof connected to power terminal 22 and the source terminal thereof connected to a node B. An enhancement mode n-channel MOS transistor 32 has its drain terminal connected to node B and its source terminal connected to the ground terminal 24.

The gate terminals of transistors 26 and 28 are connected to node B and the gate terminals of transistors 30 and 32 are connected to node A. This cross-coupled arrangement produces a regenerative effect which drive the nodes A and B to opposite voltage states. When one node is high the other is low. The circuit 20 therefore has two data states.

An input signal is provided to a terminal 38 and transmitted through an MOS input transistor 40 to the node A. An input control signal is provided to the gate terminal of transistor 40 for gating the input signal to node A.

Node B is connected through an MOS output transistor 42 to an output terminal 44. An output control signal is provided to the gate terminal of transistor 42 for gating the voltage state at node B to the output terminal 44.

Although separate input and output transistors are shown, a single transistor can be used for both input and output to the circuit 20. This single transistor can be connected to either node A or node B and can be either transistor 40 or 42. Terminal 38 can be both an input and output terminal.

Figure 7:
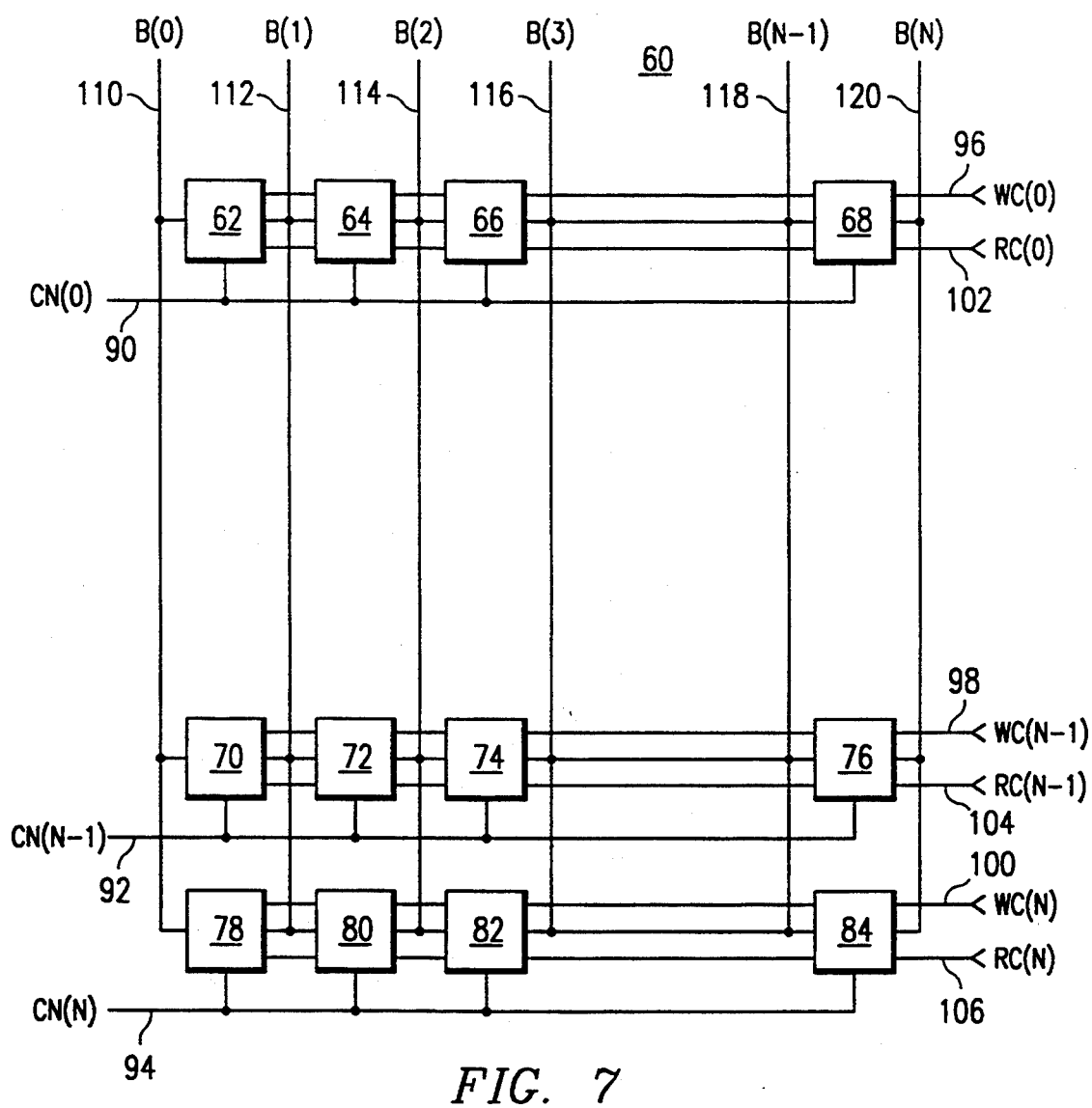
FIG. 7 is an illustration of a non-volatile memory array comprising a plurality of the memory circuits shown in FIG. 2.

A ferroelectric capacitor 50 is connected between node A and a common node C. A second ferroelectric capacitor 52 is connected between node B and the common node C. The node C extends to other circuits similar to memory circuit 20 for a common connection thereto. Likewise, the input and output control signals can be connected to other memory circuits to form an array of such circuits. Such an array is shown in FIG. 7.

The state of the circuit 20 can be set by activating the transistor 40 to receive an input signal through the terminal 38. If the input signal has a high voltage state, the node A is driven to such a high state. The high state at node A causes transistor 30 to be turned off and transistor 32 to be turned on. This pulls node B to a low voltage state. The low state at node B permits transistor 26 to be on while holding transistor 28 turned off. This further causes node A to be pulled to a high voltage state through transistor 26. When a low voltage state is received through the input transistor 40, this low state at node A permits transistor 30 to be on while holding transistor 32 off. This causes node B to be pulled to a high voltage state through transistor 30. The high state at node B turns on transistor 28 and turns off transistor 26. This causes node A to be connected to the ground terminal 24 through transistor 28.

The two states of the memory circuit 20 correspond to the data states 1 and 0. The state of the circuit 20 can be read through the output transistor 42 when the output control signal is activated. The state at the node B is transmitted through the transistor 42 to the output terminal 44. The memory circuit 42 has static operation. Therefore, reading of the circuit 20 does not affect the state stored therein. The data state can also be read through transistor 40.

In operation, as a non-volatile memory circuit, the circuit 20 has a mid-level voltage, approximately one half of $V_{cc}$, applied to the common node C. A data 1 state for the memory circuit 20 is arbitrarily defined to be node A high and node B low. In this state, the ferroelectric capacitor 50 has a positive polarization because node A is at a higher potential than node C. Ferroelectric capacitor 52 has a negative polarization because node B is at a lower potential than that of node C. Thus, the two ferroelectric capacitors are set to have differential polarization states relative to node C. When the memory circuit 20 is shifted to have a 0 data state, node A will be low and node B will be high. This reverses the electric field states applied to the ferroelectric capacitors 50 and 52 which produces reversed polarization states. Thus, no matter what the state of the circuit 20, the capacitors 50 and 52 will always have differential polarization states. Further, the ferroelectric capacitors 50 and 52 track the data state of the circuit 20 by changing polarization whenever there is a change in the data state for the circuit 20.

Figure 3:
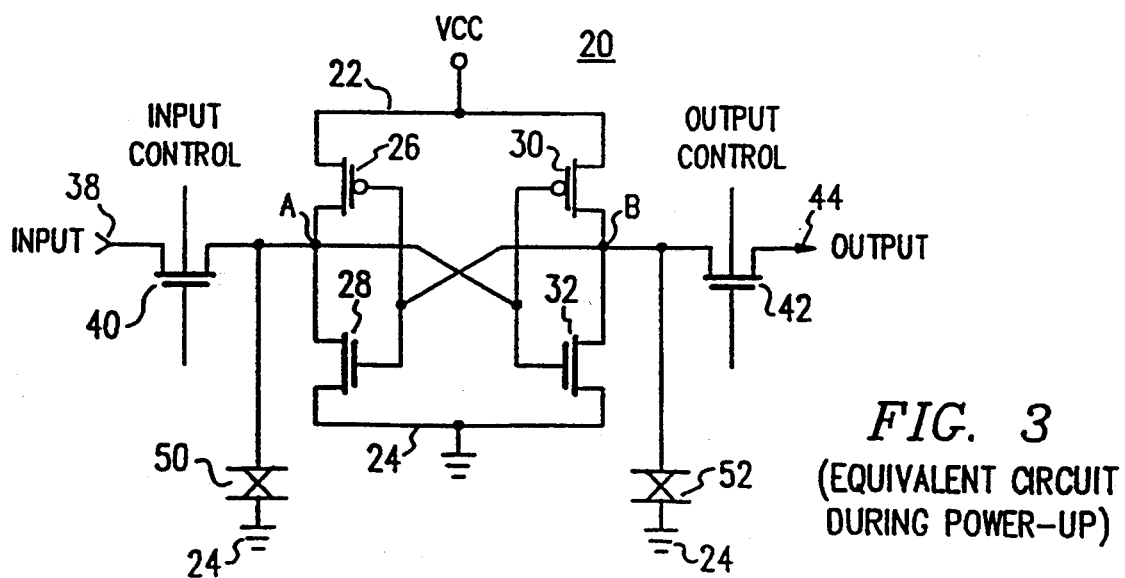
FIG. 3 is a schematic diagram illustrating an equivalent circuit of that shown in FIG. 1 wherein the common node line is grounded.

The purpose of the circuit 20 is to retain the data state stored therein after power has been removed from the circuit. This retention is carried out through the ferroelectric capacitors 50 and 52, which retain the polarization states set therein even in the absence of applied power. When power is reapplied to the circuit 20, the ferroelectric capacitors 50 and 52 unbalance the nodes A and B in such a manner to reestablish the data state which last existed in the memory circuit 20 before loss of power. For the present circuit, two methods are described for carrying out the reestablishment of the data state in the cross-coupled transistors for the memory circuit 20. The first method is described in reference to FIGS. 3 and 4 and the second method is described in reference to FIGS. 5 and 6. In FIGS. 3 and 5 similar reference numerals are utilized for the elements shown in FIG. 2.

Referring now to FIG. 3, there is shown the equivalent circuit to that shown in FIG. 2 for the case in which the common node C is held at ground during the restore operation for the circuit 20. For this condition, the ferroelectric capacitors 50 and 52 are shown connected to the ground terminal 24.

Figure 4:
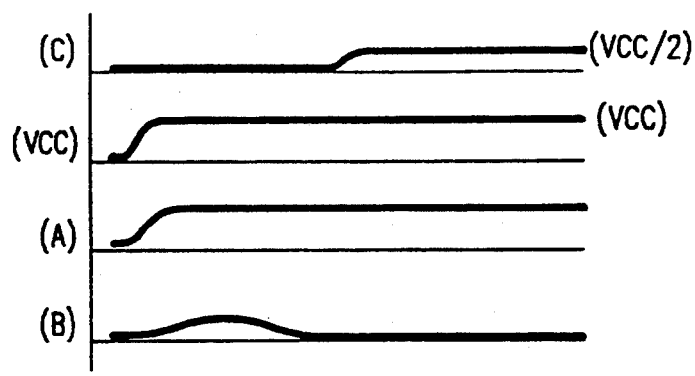
FIG. 4 is an illustration of waveforms for the equivalent circuit shown in FIG. 3.
Figure 5:
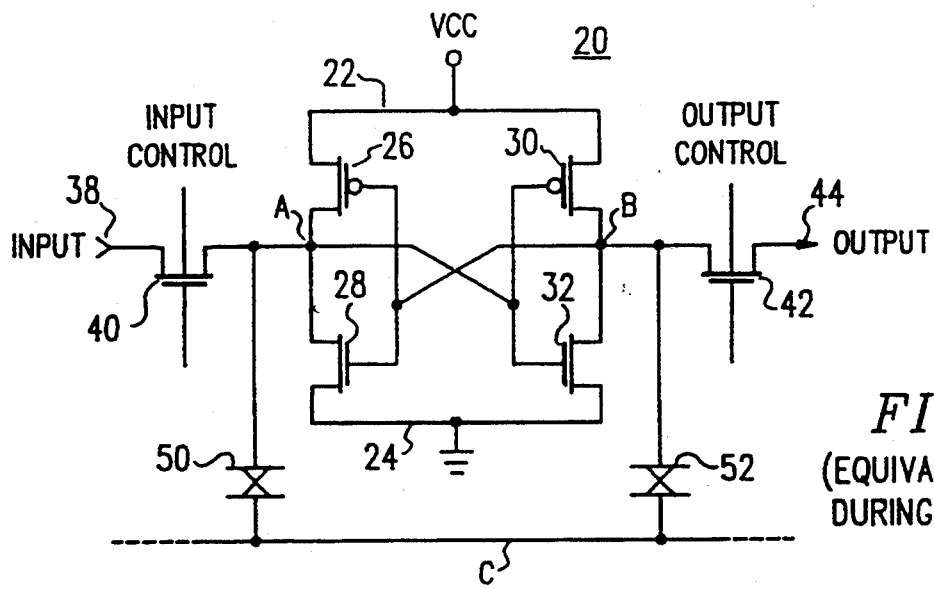
FIG. 5 is a schematic diagram illustrating an equivalent circuit to that shown in FIG. 1 wherein the common node is pulsed during power-up.

In FIG. 4 waveforms are illustrated for the common node C, the voltage supply $v_{cc}$, node A and node B. These waveforms correspond to the restore operation for the memory circuit 20, as shown in FIG. 3.

Referring now to FIGS. 3 and 4, the node C is held at ground as indicated by the first half of the waveform for node C shown in FIG. 4. For the present example it is assumed that the circuit 20 has been set to a data 1 state wherein node A is high and node B is low. Thus, the ferroelectric capacitor 50 has been set to a positive polarization state and the ferroelectric capacitor 52 has been set to a negative polarization state, both relative to node C. In this circuit configuration, the effective capacitance for a ferroelectric capacitor is greater for the reverse polarization state. This is due to the greater transition on the hysteresis curve, upon application of a positive electric field, as shown in FIG. 1. When power is applied to the circuit 20, as indicated by the rising waveform for $V_{cc}$ in FIG. 4, the nodes A and B will both begin to rise in voltage. However, due to the greater effective capacitance of ferroelectric capacitor 52, node B requires greater charge to increase voltage and therefore rises at a lesser rate than node A. This unbalanced condition, due to the capacitance difference at nodes A and B, creates an unbalanced voltage condition which is amplified by the transistors 26–32 to rapidly drive the nodes A and B to differential states, as determined by the initial unbalanced condition. As seen in the waveforms, after both of the nodes A and B rise, node A is driven to a high state while node B goes to a low state. This occurs before the common node C is returned to its normal operating condition at $v_{cc}/2$. When this transition occurs there may be small transients produced at the nodes A and B, but these do not alter the state of the circuit 20. Thus, the circuit 20 is restored to its initial state after loss of power from the circuit. Circuit 20 is therefore a non-volatile memory storage circuit.

The preferred voltages for the common node, in the above method are ground followed by a return to $v_{cc}/2$. But, it is also possible for the memory to restore itself by returning node C immediately to $v_{cc}/2$ or any voltage between power and ground.

With the present invention the preferred methods for power-up are to have the common node C either held at ground or receive a pulse voltage rising to the maximum of $V_{cc}$. However, it must be noted that the common node C can be held at any voltage level and the capacitive imbalance will cause the circuit 20 to be restored to its original condition.

Figure 6:
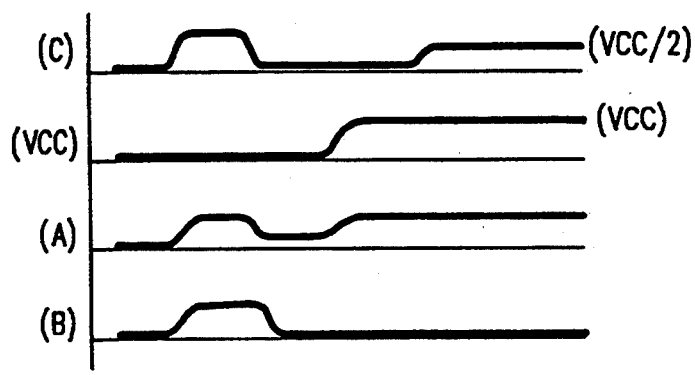
FIG. 6 is an illustration of waveforms for the equivalent circuit shown in FIG. 5.

Referring now to FIGS. 5 and 6, there is shown in FIG. 5 the equivalent circuit during power-up for the circuit 20 shown in FIG. 1, but with a pulse signal applied to the common node C. As with the previous example, it is assumed that the circuit 20 is set to a data 1 state wherein node A is high and node B is low. This establishes differential polarizations for the ferroelectric capacitors 50 and 52. Capacitor 50 has a positive polarization state and capacitor 52 has a negative polarization state. In this method of restoration, a pulse is applied to the common node C which causes a charge transfer across the ferroelectric capacitors 50 and 52 into the nodes A and B. This is shown by the initial pulses for nodes A and B corresponding in time with the voltage pulse at node C. At the termination of the voltage pulse at node C, there will be a net charge remaining at node A because the positive pulse at node C is opposite to the polarization state of capacitor 50 thereby causing the capacitor 50 to transition the full state of the hysteresis curve as opposed to the ferroelectric capacitor 52 which makes only a minor move along the hysteresis curve. The ferroelectric capacitor 50 changes state, therefore there is a net shift in current to node A. After the voltage pulse is applied to common node C, the power $V_{cc}$ ramps up to pull up the nodes A and B. However the node A is previously charged and an unbalanced condition is present. The cross-coupled feedback of the transistors causes the node A to rapidly rise and the node B to be pulled to ground, thereby reestablishing the previous data state in the memory circuit 20. After this state is reestablished, the node C is returned to its operational state at $V_{cc}/2$.

Had an opposite state had been stored in the circuit 20 for either of the examples in FIGS. 3 or 5, the restore process would have worked in the inverse fashion and produced the original data state in the memory circuit 20.

A memory array in accordance with the present invention is shown in FIG. 7. An array 60 comprises an X-Y configuration of memory circuits 62–84. Each of these memory circuits corresponds to the memory circuit 20 described above. Each row of memory circuits, such as 62–68 has a common node line, such as line 90 for these circuits. Other illustrated common node lines are shown as lines 92 and 94 for other sets of memory circuits.

For each row of memory circuits there is a common write control line (WC) and a common read control line (RC). The write control corresponds to the input control signal for the circuit 20 and the read control corresponds to the output control signal for the circuit 20. The write control signal is input to a line 96 for the row of memory circuits 62–68, line 98 for the memory circuits 70–76 and line 100 for the memory circuits 78–84. A 35 read control signal is input to a line 102 for circuits 62-68, to line 104 for circuits 70-76 and to line 106 for circuits 78-84.

Data is input and received from the array 60 through bit lines which are labeled B(0), B(1) . . . B(n). These lines are marked with reference numerals 110-120 respectively.

In operation, the array 60 is activated to write a particular row of memory circuits through the write control signal input to the write control line. The reading of a row of memory cells is accomplished by inputting a read control command to the read control line for the row, and receiving the output data for each of the memory circuits through the output lines, such as lines 110-120.

Should power be lost from the array 60, the last data states in the memory circuits are restored by applying a predetermined voltage state to the common nodes 90-94 during the power-up phase. Each of the memory circuits is reestablished using either of the methods described above in reference to circuit 20. Thus, the last data states that existed in the memory circuits, prior to loss of power, will be reestablished when power is again applied. Thus, the array 60 functions as a nonvolatile, static, random access memory. During operation of the circuit 20, the additional capacitive load represented by the ferroelectric capacitors will prevent inadvertent switching of the memory cell to the opposite state due to a direct hit from an alpha particle or other high energy particle. Single event upsets (SEU's), as they are termed, are a major problem for all circuits in the radiation environment of outer space and are becoming a problem in the earth environment as integrated circuit features shrink.

In summary, the present invention comprises a non-volatile static memory circuit having cross-coupled transistors and ferroelectric capacitors which track the state of the memory circuit. Upon loss of power, the last data state of the circuit is stored in the ferroelectric capacitors. When power is again applied, the ferroelectric capacitors unbalance the differential nodes of the circuit to reestablish the original data state.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

What we claim is:

1. A non-volatile memory circuit, comprising:
   first and second circuit means having respective first and second nodes, said first and second circuit means being cross-coupled for producing differential voltage states at said first and second nodes;
   a first ferroelectric capacitor connected between said first node and a common node;
   a second ferroelectric capacitor connected between said second node and said common node, wherein said ferroelectric capacitors are set to polarization states by the voltage states at said first and second nodes relative to said common node; and
   said first and second ferroelectric capacitors storing said polarization states and providing different effective capacitances as a function of the polarization states stored as non-volatile data.

2. The non-volatile memory circuit as recited in claim 1, further including;
   an input transistor connected between said first node and an input node for receiving an input signal for setting the voltage states at said first and second nodes; and
   an output transistor connected between said second node and an output node for providing the voltage state at said second node to said output node.

3. The non-volatile memory circuit as recited in claim 1, wherein each of said first and second circuit means comprises a series combination of a p-channel field effect transistor and an n-channel field effect transistor connected between first and second power terminals, and said first and second nodes are located respectively at a junction of said p-channel transistor and said n-channel transistor.

4. The non-volatile memory circuit as recited in claim 1, further including an input/output transistor connected between either said first node or said second node and an input/output node of said memory circuit.

5. A non-volatile memory circuit comprising:
   first and second circuit means having respective first and second nodes, said first and second circuit means being cross-coupled for producing differential voltage states at said first and second nodes;
   a first ferroelectric capacitor connected between said first node and a common nodes; and
   a second ferroelectric capacitor connected between said second node and said common node, wherein said ferroelectric capacitors are set to polarization states by the voltage states at said first and second nodes relative to said common node; and
   said common node is connected to receive a voltage which is approximately one half of the supply voltage provided to said memory circuit.

6. A non-volatile memory circuit, comprising:
   a first transistor means connected between first and second power terminals and having a first node;
   a second transistor means connected between said first and second power terminals and having a second node, said first and second transistor means being cross-coupled for driving said first and second nodes to differential voltage states;
   a first ferroelectric capacitor connected between said first node and a common node, said common node held at a voltage state between the voltages of said first and second power terminals; and
   a second ferroelectric capacitor connected between said second node and said common node, wherein said first and second ferroelectric capacitors have opposite polarization states set therein due to the voltage states at said first and second nodes relative to said common node.

7. The non-volatile memory circuit as recited in claim 6, further including:
   an input transistor connected between said first node and an input node for receiving an input signal for setting the voltage states at said first and second nodes; and
   an output transistor connected between said second node and an output node for providing the voltage state at said second node to said output node.

8. The non-volatile memory circuit as recited in claim 6, further including an input/output transistor connected between either said first node or said second node and an input/output node for setting and reading the voltage states at said first and second nodes.

9. A non-volatile memory circuit comprising:

a first transistor means connected between first and second power terminals and having a first node;

a second transistor means connected between said first and second power terminals and having a second node, said first and second transistor means being cross-coupled for driving said first and second nodes to differential voltage states;

a first ferroelectric capacitor connected between said first node and a common node, being said common node held at a voltage state between the voltages of said first and second power terminals;

a second ferroelectric capacitor connected between said second node and said common node, wherein said ferroelectric capacitors have opposite polarization states set therein due to the voltage states at said first and second nodes relative to said common node; and said common node is connected to receive a voltage which is approximately one half of the voltage applied between said first and second power terminals.

10. A non-volatile static memory circuit, comprising:

first and second MOS transistors connected serially between first and second power terminals and joined at a first node, said first transistor being an enhancement mode p-channel device and said second transistor being an enhancement mode n-channel device;

third and fourth MOS transistors connected serially between said first and second power terminals and joined at a second node, said third transistor being an enhancement mode p-channel device and said fourth transistor being an enhancement mode n-channel device;

the gate terminals of said first and second transistors connected to said second node and the gate terminals of said third and fourth transistors connected to said first node, wherein said first and said second nodes are driven to differential voltage states;

a first ferroelectric capacitor connected between said first node and a common node;

a second ferroelectric capacitor connected between said second node and said common node; and said first and second ferroelectric capacitors providing different effective capacitances as a function of the polarization states stored therein.

11. The non-volatile static memory circuit as recited in claim 10, further including:

an input transistor connected between said first node and an input node for receiving an input signal for setting the voltage states of said first and second nodes; and an output transistor connected between said second node and an output node for transferring the state of said second node to said output node.

12. The non-volatile static memory circuit as recited in claim 10, further including an input/output transistor connected between either said first node or said second node and an input/output node for setting the voltage states of said first and second nodes and reading the voltage states of said first and second nodes.

13. A non-volatile static memory circuit, comprising:

first and second MOS transistors connected serially between first and second power terminals and joined at a first node, said first transistor being an enhancement mode p-channel device and said second transistor being an enhancement mode n-channel device;

third and fourth MOS transistors connected serially between said first and second power terminals and joined at a second node, said third transistor being an enhancement mode p-channel device and said fourth transistor being an enhancement mode n-channel device;

the gate terminals of said first and second transistors connected to said second node and the gate terminals of said third and fourth transistors connected to said first node, wherein said first and said second nodes are driven to differential voltage states;

a first ferroelectric capacitor connected between said first node and a common node;

a second ferroelectric capacitor connected between said second node and said common node; and said common node is connected to receive a voltage which is approximately one half of the voltage applied between said first and second power terminals.

14. A non-volatile memory circuit array, comprising:

an array of memory circuits, each memory circuit comprising:

a first transistor means connected between first and second power terminals and having a first node;

a second transistor means connected between said first and second power terminals and having a second node, said first and second transistor means being cross-coupled for driving said first and second nodes to differential voltage states;

a first ferroelectric capacitor connected between said first node and a common node, said common node held at a voltage state between the voltages of said first and second power terminals;

a second ferroelectric capacitor connected between said second node and said common node, wherein said ferroelectric capacitors have opposite polarization states set therein due to the voltage states at said first and second nodes relative to said common node; and the common nodes being connected to a plurality of said memory circuits joined together for receiving a restore signal.

15. The non-volatile memory circuit array as recited in claim 14, further including an input and output transistor for each of said memory circuits, said input transistor connected between the first node and an input node for each of said memory circuits, said input transistor for receiving an input signal for setting the voltage states at the first and second nodes for the corresponding memory circuit, a plurality of said input nodes being connected in common; and an output transistor connected between said second node and an output node for each of said memory circuits for providing the voltage state at said second node to said output node, a plurality of said output nodes being connected in common.

16. The non-volatile memory circuit array as recited in claim 14, further including an input/output transistor for each of said memory circuits, said input/output transistor connected between either said first node or said second node and an input/output node for setting the voltage states at said first and second nodes and for reading the voltage state at either said first or second nodes, a plurality of said input/output nodes being connected in common to function as a bit line.

17. The non-volatile memory circuit as recited in claim 14, wherein said common nodes are connected to receive a voltage which is approximately one half of the voltage applied between said first and second power terminals.

18. A method of operation for a non-volatile memory circuit, comprising the steps of:
driving first and second nodes of said memory circuit to differential voltage states to store either a first or a second data state in said memory circuit;
applying the voltage state at said first node to a first ferroelectric capacitor having one terminal thereof connected to a common node, to establish a corresponding polarization state in said first ferroelectric capacitor; and
applying the voltage state at said second node to a second ferroelectric capacitor having one terminal thereof connected to said common node, to establish a corresponding polarization state in said second ferroelectric capacitor, wherein said first and second ferroelectric capacitors have differential polarization states set therein relative to said common node and produce different effective capacitances as a function of the polarization states.

19. The method of operation for a non-volatile memory circuit as recited in claim 18, further including the steps of:
removing power from said memory circuit to remove said voltage state from said first and second nodes;
applying power to said memory circuit and concurrently unbalancing said first and second nodes as a result of a connection of said ferroelectric capacitors thereto; and
driving said first and second nodes of said memory circuit to reestablish the differential voltage states at said first and second nodes due to said unbalancing produced by said ferroelectric capacitors.

20. The method of operation for a non-volatile memory circuit as recited in claim 18, further including the step of holding said common node at a predetermined voltage state during a portion of the operation of said memory circuit.

21. A method of operation for a non-volatile memory circuit, comprising the steps of:
driving first and second nodes of said circuit to differential voltage states to store either a first or a second data state in said memory circuit;
applying the voltage state at said first node to a first ferroelectric capacitor, which has one terminal thereof connected to a common node, to establish a corresponding polarization state in said first ferroelectric capacitor;
applying the voltage state at said second node to a second ferroelectric capacitor, which has one terminal thereof connected to said common node, to establish a corresponding polarization state in said second ferroelectric capacitor, wherein said first and second ferroelectric capacitors have differential polarization states set therein relative to said common node; and
applying to said common node a voltage which is approximately one half of the supply voltage provided to said memory circuit.

22. A method of operation for a non-volatile memory circuit, comprising the steps of:
driving first and second nodes of said circuit to differential voltage states to store either a first or a second data state in said memory circuit;
applying the voltage state at said first node to a first terminal of a first ferroelectric capacitor having a second terminal thereof connected to a common node, to establish a corresponding polarization state in said first ferroelectric capacitor;
applying the voltage state at said second node to a first terminal of a second ferroelectric capacitor having a second terminal thereof connected to a common node, to establish a corresponding polarization state in said second ferroelectric capacitor, wherein said first and second ferroelectric capacitors have differential polarization states set therein and produce different effective capacitances as a function of the polarization states;
removing said voltage states from said first and second nodes; and
restoring said voltage states to said first and second nodes in response to the corresponding polarization states previously set in said first and second ferroelectric capacitors, thereby restoring the previously stored first or second data state to said memory circuit.

23. The method of operation for a non-volatile memory circuit as recited in claim 22, wherein the step of restoring said voltage states includes the step of driving said common node to a predetermined voltage state for a predefined period of time.

24. The method of operation for a non-volatile memory circuit as recited in claim 23, wherein said predetermined voltage state is a circuit low voltage.

25. A method of operation for a non-volatile memory circuit, comprising the steps of:
driving first and second nodes of said circuit to differential voltage states to store either a first or a second data state in said memory circuit;
applying the voltage state at said first node to a first terminal of a first ferroelectric capacitor, which has a second terminal thereof connected to a common node, to establish a corresponding polarization state in said first ferroelectric capacitor;
applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein;
removing said voltage states from said first and second nodes;
restoring said voltage states to said first and second nodes in response to the corresponding polarization states previously set in said first and second ferroelectric capacitors, thereby restoring the previously stored first or second data state to said memory circuit; and
applying to said common node a voltage which is approximately one half of the supply voltage provided to said memory circuit.

26. A method of operation for a non-volatile memory circuits comprising the steps of:
driving first and second nodes of said circuit to differential voltage states to store either a first or a second data state in said memory circuit;
applying the voltage state at said first node to a first terminal of a first ferroelectric capacitor, which has a second terminal thereof connected to a common node, to establish a corresponding polarization state in said first ferroelectric capacitor;
applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein;

removing said voltage states from said first and second nodes;

restoring said voltage states to said first and second nodes in response to the corresponding polarization states previously set in said first and second ferroelectric capacitors, thereby restoring the previously stored first or second data state to said memory circuit; and driving said common node to a voltage which is approximately one half of the supply voltage provided to said memory circuit after the step of restoring said voltage states.

27. A method of operation for a non-volatile memory circuit, comprising the steps of:

driving first and second nodes of said memory circuit to differential voltage states to store either a first or a second data state in said memory circuit, said memory circuit connected to receive power from first and second power terminals;

applying the voltage state at said first node to a first terminal of a ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein, and wherein the effective capacitance of each of said ferroelectric capacitors is a function of the polarization state stored therein;

removing said power from said memory circuit, thereby removing the voltage states at said first and second nodes of said memory circuit;

driving said common node to a predetermined voltage state; and applying said power to said memory circuit while said common node is held at said predetermined voltage state, to drive said first and second nodes to said previous voltage states due to the different effective capacitances of said ferroelectric capacitors connected respectively to said first and second nodes, thereby reestablishing said given data state stored in said memory circuit.

28. The method of operation for a non-volatile memory circuit as recited in claim 27, wherein the step of driving said common node to a predetermined voltage state includes maintaining said common node at a low voltage state.

29. The method of operation for a non-volatile memory circuit as recited in claim 28, wherein said low voltage state is essentially circuit ground.

30. A method of operation for a non-volatile memory circuit, comprising the steps of:

driving first and second nodes of said circuit to differential voltage states to store either a first or a second data state in said memory circuit, said circuit connected to receive power from first and second power terminals;

applying the voltage state at said first node to a first terminal of a first ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein, and wherein an effective capacitance of each said ferroelectric capacitor is a function of the respective polarization state stored therein;

removing said power from said circuit, thereby removing the differential voltage states at said first and second nodes after said circuit has stored a given data state;

driving said common node to a predetermined voltage state;

applying said power to said circuit while said common node is held at said predetermined voltage state, to drive said first and second nodes to said previous voltage states due to different effective capacitances of said ferroelectric capacitors connected respectively to said first and second nodes, thereby reestablishing said given data state in said memory circuit; and applying to said common node a voltage which is approximately one half of the voltage provided between said first and second power terminals when power is applied to said circuit.

31. A method of operation for a non-volatile memory circuit, comprising the steps of:

driving first and second nodes of said circuit to differential voltage states to store either a first or a second data state in said memory circuit, said circuit connected to receive power from first and second power terminals;

applying the voltage state at said first node to a first terminal of a first ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein, and wherein an effective capacitance of each said ferroelectric capacitor is a function of the respective polarization state stored therein;

removing said power from said circuit, thereby removing the voltage states at said first and second nodes after said circuit has stored a given data state;

driving said common node to a predetermined voltage state;

applying said power to said circuit while said common node is held at said predetermined voltage state, to drive said first and second nodes to said previous voltage states due to different effective capacitances of said first and second ferroelectric capacitors connected respectively to said first and second nodes, thereby reestablishing said given data state in said memory circuit; and driving said common node to a voltage which is approximately one half of the voltage applied between said first and second power terminals after application of said predetermined voltage state to said common node.

32. A method of operation for a non-volatile memory circuit, comprising the steps of:

driving first and second nodes of said memory circuit to differential voltage states to store either a first or a second data state in said memory circuit, said memory circuit being connected to receive power from first and second power terminals;

applying the voltage state at said first node to a first terminal of a first ferroelectric capacitor having a second terminal thereof connected to a common node, to establish a corresponding polarization state in said first ferroelectric capacitor;

applying the voltage state at said second node to a first terminal of a second ferroelectric capacitor having a second terminal thereof connected to said common node, to establish a corresponding polarization state in said second ferroelectric capacitor, wherein said first and second ferroelectric capacitors have differential polarization states set therein and an effective capacitance of each of said ferroelectric capacitors is a function of the polarization state stored therein;

removing power from said circuit, thereby removing the voltage states at said first and second nodes when said memory circuit has a given data state;

applying a voltage pulse to said common node to transfer respective electrical charges to said first and second nodes, whereby different charges are retained at said first and second nodes after termination of said pulse due to the different polarization states of said first and second ferroelectric capacitors; and applying power to said memory circuit after termination of said pulse to drive said first and second nodes to said given voltage states due to said different electrical charges retained at said first and second nodes, thereby reestablishing said given data state previously stored in said memory circuit.

33. A method of operation for a non-volatile memory circuit, comprising the steps of:

driving first and second nodes of said circuit to differential voltage states to store either a first or a second data state in said memory circuit, said circuit connected to receive power from first and second power terminals;

applying the voltage state at said first node to a first terminal of a first ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein and an effective capacitance of each said ferroelectric capacitor is a function of the respective polarization state stored therein;

removing said power from said circuit, thereby removing the voltage states at said first and second nodes after said circuit has stored a given data state;

applying a voltage pulse to said common node to transfer respective electrical charges to said first and second nodes, whereby different charges are retained at said first and second nodes after termination of said pulse due to the different polarization states of said first and second ferroelectric capacitor;

applying power to said circuit after termination of said pulse, to drive said first and second nodes to said previous differential voltage states due to said different electrical charges transferred to said first and second nodes, thereby reestablishing said given data state in said memory circuit; and the step of applying a voltage pulse to said common node comprises applying a voltage pulse having an amplitude essentially equal to the voltage difference between said first and second power terminals.

34. A method of operation for a non-volatile memory circuit, comprising the steps of:

driving first and second nodes of said circuit to differential voltage states to store either a first or a second data state in said memory circuit, said circuit connected to receive power from first and second power terminals;

applying the voltage state at said first node to a first terminal of a first ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein and an effective capacitance of each said ferroelectric capacitor is a function of the respective polarization state stored therein;

removing said power from said circuit, thereby removing the voltage states at said first and second nodes after said circuit has stored a given data state;

applying a voltage pulse to said common node to transfer respective electrical charges to said first and second nodes, whereby different charges are retained at said first and second nodes after termination of said pulse due to the different polarization states of said first and second ferroelectric capacitors;

applying said power to said circuit after termination of said pulse, to drive said first and second nodes to said previous differential voltage states due to said different charges transferred to said first and second nodes, thereby reestablishing said given data state in said memory circuit; and holding said common node at a voltage which is approximately one half of the voltage provided between said first and second power terminals when power is applied to said memory circuit.

35. A method of operation for a non-volatile memory circuit, comprising the steps of:

driving first and second nodes of said circuit to differential voltage states to store either a first or a second data state in said memory circuit, said circuit connected to receive power from first and second power terminals;

applying the voltage state at said first node to a first terminal of a first ferroelectric capacitor, which has a second terminal thereof connected to a common node, to establish a corresponding polarization state in said first ferroelectric capacitor;

applying the voltage state at said second node to a first terminal of a second ferroelectric capacitor, which has a second terminal thereof connected to said common node, to establish a corresponding polarization state in said second ferroelectric capacitor, wherein said first and second ferroelectric capacitors have differential polarization states set therein and an effective capacitance of each said ferroelectric capacitor is a function of the respective polarization state stored therein;

removing said power from said circuit, thereby removing the voltage states at said first and second nodes after said circuit has stored a given data state;

applying a voltage pulse to said common node to transfer respective electrical charges to said first and second nodes, whereby different charges are retained at said first and second nodes after termination of said pulse due to the different polarization states of said first and second ferroelectric capacitors;

applying said power to said circuit after termination of said pulse, to drive said first and second nodes to said previous differential voltage states due to said different charges transferred to said first and second nodes, thereby reestablishing said given data state in said memory circuit; and driving said common node to a voltage which is approximately one half of the voltage applied between said first and second power terminals after application of said voltage pulse to said common node.

36. A method of operation for a non-volatile memory circuit, comprising the steps of:

converting a data state comprising differential voltage states at respective first and second nodes of a volatile memory circuit to differential polarization states in respective first and second ferroelectric capacitors;

removing power from the volatile memory circuit subsequent to storing the data state as the differential polarization states in the first and second ferroelectric capacitors;

applying power to a first terminal of each of the first and second ferroelectric capacitors to transfer respective electrical charges as a function of the polarization states from second terminals of the respective first and second ferroelectric capacitors to the respective first and second nodes of the volatile memory circuit; and applying power to the volatile memory circuit, whereby the first and second nodes thereof are driven to differential voltage states corresponding to the data state existing thereat before power was removed from the volatile memory circuit.

37. The method of operation for a non-volatile memory circuit as recited in claim 36, wherein the step of applying power to the first terminal of each of the ferroelectric capacitors comprises applying about half the voltage applied in powering the volatile memory circuit.

38. The method of operation for a non-volatile memory circuit as recited in claim 36, wherein the step of applying power to the first terminal of each of the ferroelectric capacitors comprises applying a voltage thereto having a magnitude between a circuit common voltage and a voltage magnitude that is applied in powering the volatile memory circuit.

39. The method of operation for a non-volatile memory circuit as recited in claim 36, wherein the step of applying power to the first terminal of each of the ferroelectric capacitors is carried out after the power is applied to the volatile memory circuit.

40. The method of operation for a non-volatile memory circuit as recited in claim 36, wherein the step of applying power to the first terminal of each of the ferroelectric capacitors comprises applying a voltage pulse thereto.

41. The method of operation for a non-volatile memory circuit as recited in claim 40, wherein the step of applying power to the volatile memory circuit comprises applying a supply voltage thereto after pulsing the first terminal of the respective ferroelectric capacitors.

42. The non-volatile memory circuit of claim 18, further including pulsing the common node to drive charge from the ferroelectric capacitors to the respective first and second nodes, returning the pulse to a low voltage level, and then applying a supply voltage to the non-volatile memory circuit to drive the first and second nodes to the respective voltage states.

43. The non-volatile memory circuit of claim 42, further including driving the common node to a voltage approximately half the supply voltage after the supply voltage has been applied to the non-volatile memory circuit.

44. The method of operation for a non-volatile memory circuit as recited in claim 18, further including automatically tracking a change in the voltage states of the first and second nodes with corresponding polarization states in the first and second ferroelectric capacitors.

* * * * *

UNITED STATES PATENT AND TRADEMARK OFFICE
CERTIFICATE OF CORRECTION

PATENT NO. : 5,434,811
DATED : July 18, 1995
INVENTOR(S) : Evans, Jr., et al.

It is certified that error appears in the above-indentified patent and that said Letters Patent is hereby corrected as shown below:

Title page , item [21] , S/N 356,661 should be S/N 356,619.

Col. 8, line 20, after "circuit", insert a comma.

Col. 8, line 67, after "circuit", insert a comma.

Col. 9, line 9, delete "being".

Col. 9, line 10, after "node", insert --being--.

Col. 12, line 58, delete "circuits", insert --circuit--.

Col. 12, line 58, after "circuit", insert a comma.

Col. 16, lines 10-11, delete "capacitor", insert --capacitors--.

Signed and Sealed this

Fifteenth Day of April, 1997

Attest:

BRUCE LEHMAN

*Attesting Officer*     *Commissioner of Patents and Trademarks*